United States Patent
Cho

(10) Patent No.: US 7,076,013 B2
(45) Date of Patent: Jul. 11, 2006

(54) CLOCK SYNCHRONIZATION DEVICE

(75) Inventor: Yong Deok Cho, Ichon-shi (KR)

(73) Assignee: Hynix Semiconductor Inc., Kyoungki-Do (KR)

(*) Notice: Subject to any disclaimer, the term of this patent is extended or adjusted under 35 U.S.C. 154(b) by 760 days.

(21) Appl. No.: 10/330,659

(22) Filed: Dec. 27, 2002

(65) Prior Publication Data

US 2003/0123597 A1    Jul. 3, 2003

(30) Foreign Application Priority Data

Dec. 28, 2001    (KR) .............................. 2001-86676

(51) Int. Cl.
*H04L 7/00* (2006.01)
(52) U.S. Cl. .................. 375/354; 327/158; 327/159; 327/161; 370/517
(58) Field of Classification Search .............. 375/354, 375/373, 376; 327/156, 158, 159, 160, 162; 370/503, 517, 518

See application file for complete search history.

(56) References Cited

U.S. PATENT DOCUMENTS 5,243,227 A    9/1993  Gutierrez, Jr. et al. ...... 307/605
6,483,359 B1*  11/2002 Lee .............................. 327/158
6,552,587 B1*  4/2003  Kim et al. .................... 327/158
6,587,534 B1*  7/2003  Hassoun et al. ............. 375/376

FOREIGN PATENT DOCUMENTS

| KR | 1998-0087852 | 12/1999 |
| KR | 1020000023294 | 4/2000 |
| KR | 1020010007099 | 1/2001 |

OTHER PUBLICATIONS

Notice of Rejection (with translation), corresponding to Korean Patent Application Serial No. 2001-0086676, Korean Intellectual Property Office, dated Mar. 24, 2005, 6 pages (including translation).

* cited by examiner

*Primary Examiner*—Dac V. Ha
(74) *Attorney, Agent, or Firm*—Marshall, Gerstein & Borun LLP

(57) ABSTRACT

A clock synchronization device is disclosed which optimizes clock skew without increasing the number of unit delay cells by using an auxiliary delay circuit when a clock signal of ultra low frequency is inputted and improves operation frequency by using different programmable dividers to operate at different division rates when clock signals of high frequency and low frequency are inputted. Additionally, the optimum clock synchronization device may be embodied by using a replica delay unit corresponding with the package type.

11 Claims, 5 Drawing Sheets

CLOCK SYNCHRONIZATION DEVICE

TECHNICAL FIELD

The disclosed device generally relates to clock synchronization devices, and more particularly, to a clock synchronization circuit of a semiconductor memory device which optimizes a clock skew without increasing the number of unit delay cells by using an auxiliary delay circuit when a clock signal of ultra low frequency is inputted. The clock synchronization circuit uses a programmable divider when a clock signal of high frequency or low frequency is inputted, thereby improving the operation frequency by more than 2 times.

BACKGROUND

FIG. 1 is a block diagram illustrating a conventional clock synchronization circuit. A register controller delay locked loop circuit (hereinafter, referred to as 'RCDLL') is explained as an example. The RCDLL includes a clock buffer 1, a variable delay line 2, a divider 3, a dummy variable delay line 4, a dummy input/output data buffer 5, a dummy clock buffer 6, a phase detection unit 7 and a shift register 8.

The clock buffer 1 transmits an external clock signal ECLK into an internal circuitry.

The variable delay line 2 includes a plurality of unit delay cells connected in series which delay a reference clock signal RCLK from the clock buffer 1 for a predetermined time, to output an internal clock signal INCLK.

The divider 3 divides a period of the reference clock signal RCLK from the clock buffer 1 in order to rapidly synchronize the internal clock signal TNCLK to the reference clock signal RCLK. Here, a ⅛ divider is used.

The dummy variable delay line 4, which is a dummy circuit, delays a division clock signal DCLK divided by the divider 3 for the same delay time as the variable delay line 2 does.

The dummy input/output data buffer 5, which is a dummy circuit, has the same structure as an actual input/output data buffer.

The dummy clock buffer 6, which is a dummy circuit, has the same structure as the clock buffer 1.

The phase detection unit 7 compares a phase of a clock signal from the dummy clock buffer 6 with that of the clock signal DCLK from the divider 3.

The shift register 8 adjusts the delay time of the variable delay line 2 and the dummy variable delay line 4 according to an output signal from the phase detection unit 7.

The divider 3 is used for the purpose of synchronizing the internal clock signal INCLK to the external clock signal ECLK without a delay time when the external clock signal ECLK having a low frequency is inputted. The division clock signal DCLK generated by dividing the reference clock signal RCLK is used by the dummy circuit for controlling the shift register 8.

However, the number of unit delay cells composing the variable delay line 2 needs to be increased as the frequency of the external clock signal ECLK becomes lower. As a result, a large number of unit delay cells are required when an external clock signal ECLK having a low frequency is used. For example, if a unit delay cell has a unit delay rate of 0.1 ns when an external clock signal ECLK of 66 MHz is used as an operation clock signal, 150 unit delay cells are required, thereby increasing the chip layout area and current consumption during the operation.

In addition, when an external clock signal ECLK having a high frequency is inputted, the phase detection unit 7 compares the phases of the signals for one period by using a division clock signal DCLK divided by the divider 3. A frequency having a delay time corresponding to the phase difference between the external clock signal ECLK and the internal clock signal INCLK becomes the maximum operation frequency. As a result, this type of clock synchronization device is not used in high-speed DDR SDRAM.

SUMMARY OF THE DISCLOSURE

A clock synchronization device includes: a variable delay line arranged to delay an external clock signal for a predetermined time and output an internal clock signal; an auxiliary delay line arranged to delay an internal clock signal from the variable delay line by differentially setting a delay path, from among a plurality of delay paths, according to a frequency of the external clock signal; a programmable divider arranged to differentially set a division rate according to the frequency of the external clock signal; a phase detection unit arranged to compare a phase of an output clock signal from the programmable divider with a phase of an output clock signal from a dummy circuit, the dummy circuit having the same structure as circuits arranged to output the internal clock signal; and a shift register arranged to adjust the delay time of the variable delay line according to output signals from the phase detector.

DETAILED DESCRIPTION

Figure 1:
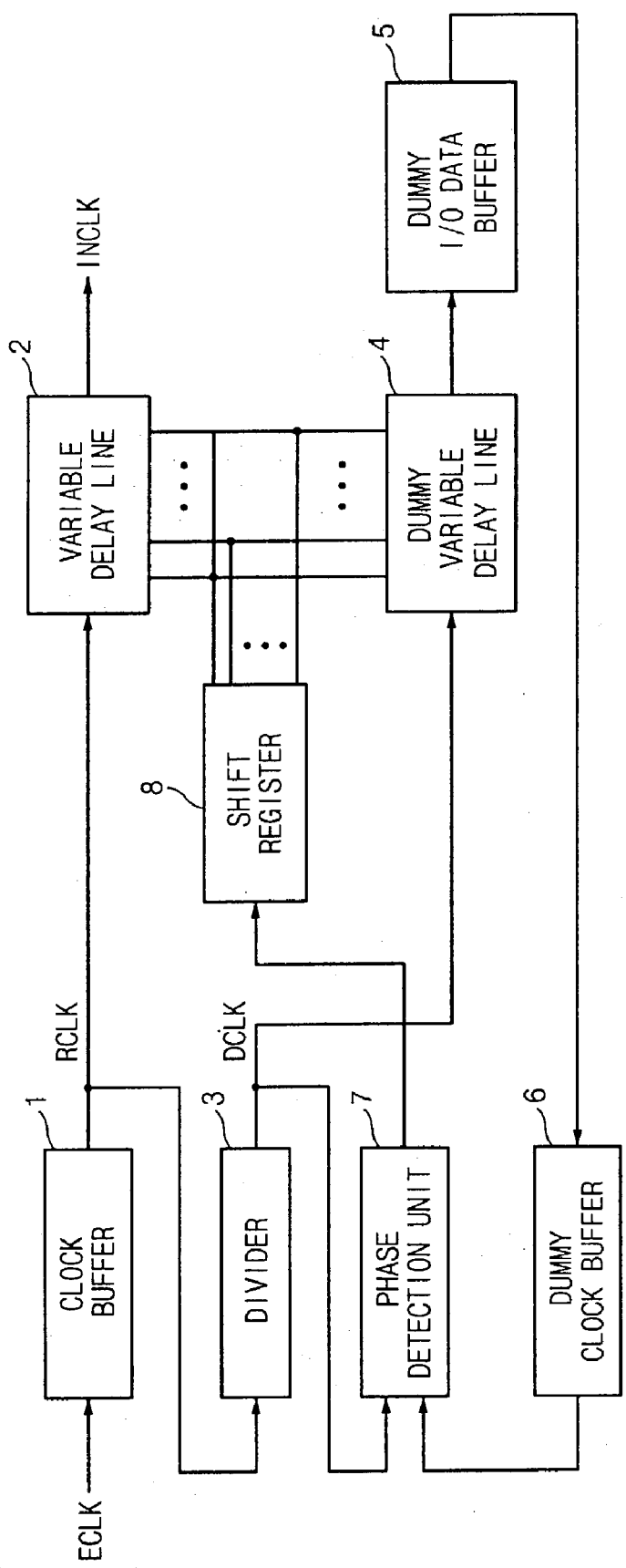
FIG. 1 is a block diagram illustrating a conventional delay locked loop circuit.
Figure 2:
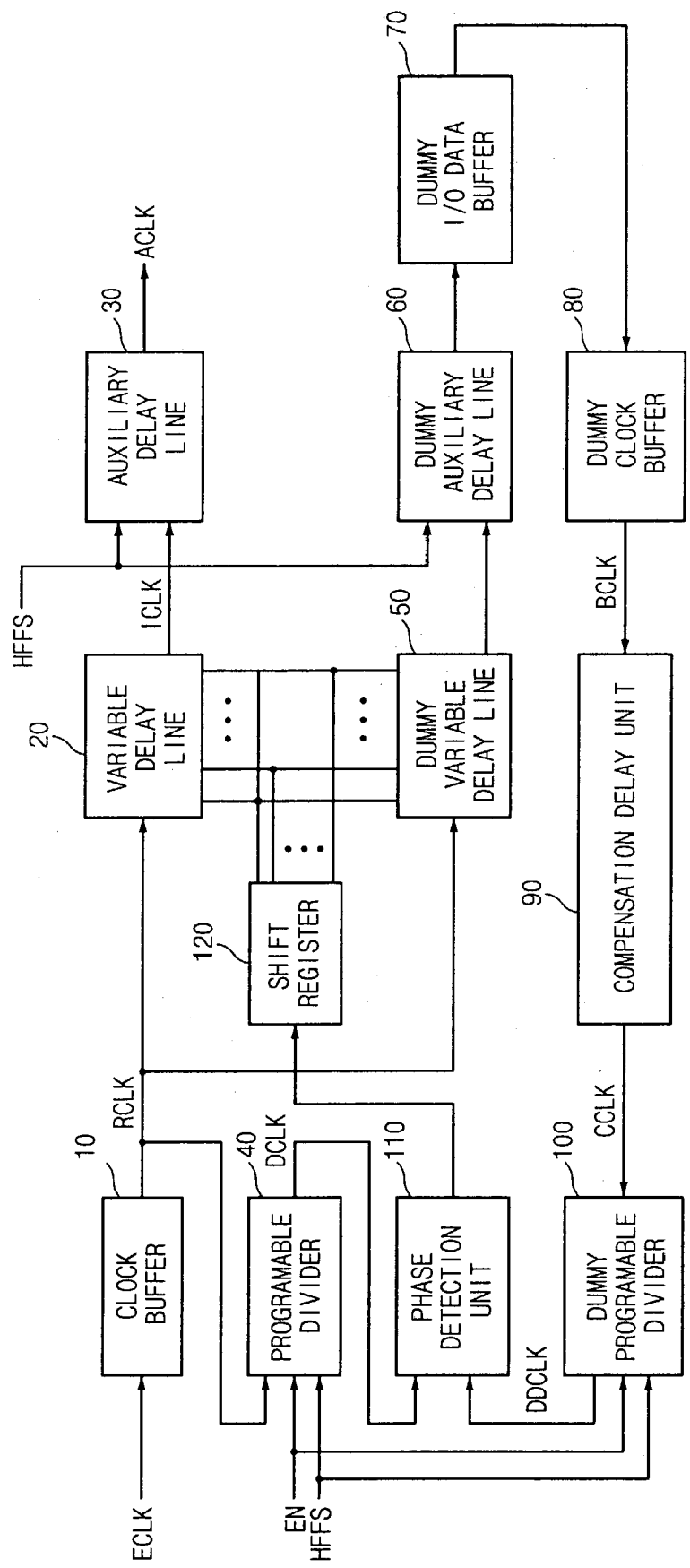
FIG. 2 is a block diagram illustrating an example of a delay locked loop circuit.

The disclosed clock synchronization device will be explained in more detail by referring to the accompanying drawings. FIG. 2 is a block diagram illustrating an example of a delay locked loop circuit. In particular, a register controlled delay locked loop circuit RCDLL is described The register controlled DLL RCDLL includes a clock buffer 10, a variable delay line 20, an auxiliary delay line 30, a programmable divider 40, a dummy variable delay line 50, a dummy auxiliary delay line 60, a dummy input/output data buffer 70, a dummy clock buffer 80, a compensation delay unit 90, a dummy programmable divider 100, a phase detection unit 110 and a shift register 120.

The clock buffer 10 transmits an external clock signal ECLK into an internal circuitry.

The variable delay line 20 includes of a plurality of unit delay cells connected in series which delay a reference clock signal RCLK from the clock buffer 10 for a predetermined time, to synchronize the reference clock signal RCLK to an internal clock signal ICLK.

The auxiliary delay line 30 adjusts the delay rate according to a flag signal HFFS. Here, the flag signal HFFS is enabled when the external clock signal ECLK has a high frequency.

The programmable divider 40 changes division values according to the flag signal HFFS. In other words, the programmable divider 40 operates as a ½ divider when the flag signal HFFS is at a high level, and operates as a ¼ divider when the HFFS is at a low level.

The dummy variable delay line 50, which is a dummy circuit, delays a division clock signal DCLK divided by the programmable divider 40 for the same delay time as the variable delay line 20 does.

The dummy auxiliary delay line 60, which is a dummy circuit, having the same structure as the auxiliary delay line 30, adjusts the delay rate according to the flag signal HFFS.

The dummy input/output data buffer 70, which is a dummy circuit, has the same structure as an actual input/output data buffer.

The dummy clock buffer 80, which is a dummy circuit, has the same structure as the clock buffer 10.

The compensation delay unit 90 is a delay circuit for compensating the delay time due to values of load capacitance in input/output pads according to the package type of the chip.

The dummy programmable divider 100, having the same structure as the programmable divider 40, divides a clock signal CCLK compensated by the compensation delay unit 90 by changing division values according to the flag signals HFFS.

The phase detection unit 110 compares the phase of the clock signal outputted from the dummy programmable divider 100 with that of the clock signal outputted from the programmable divider 40.

The shift register 120 adjusts the delay time of the variable delay line 20 and the dummy variable delay line 50 according to output signals from the phase detection unit 110.

Figure 3:
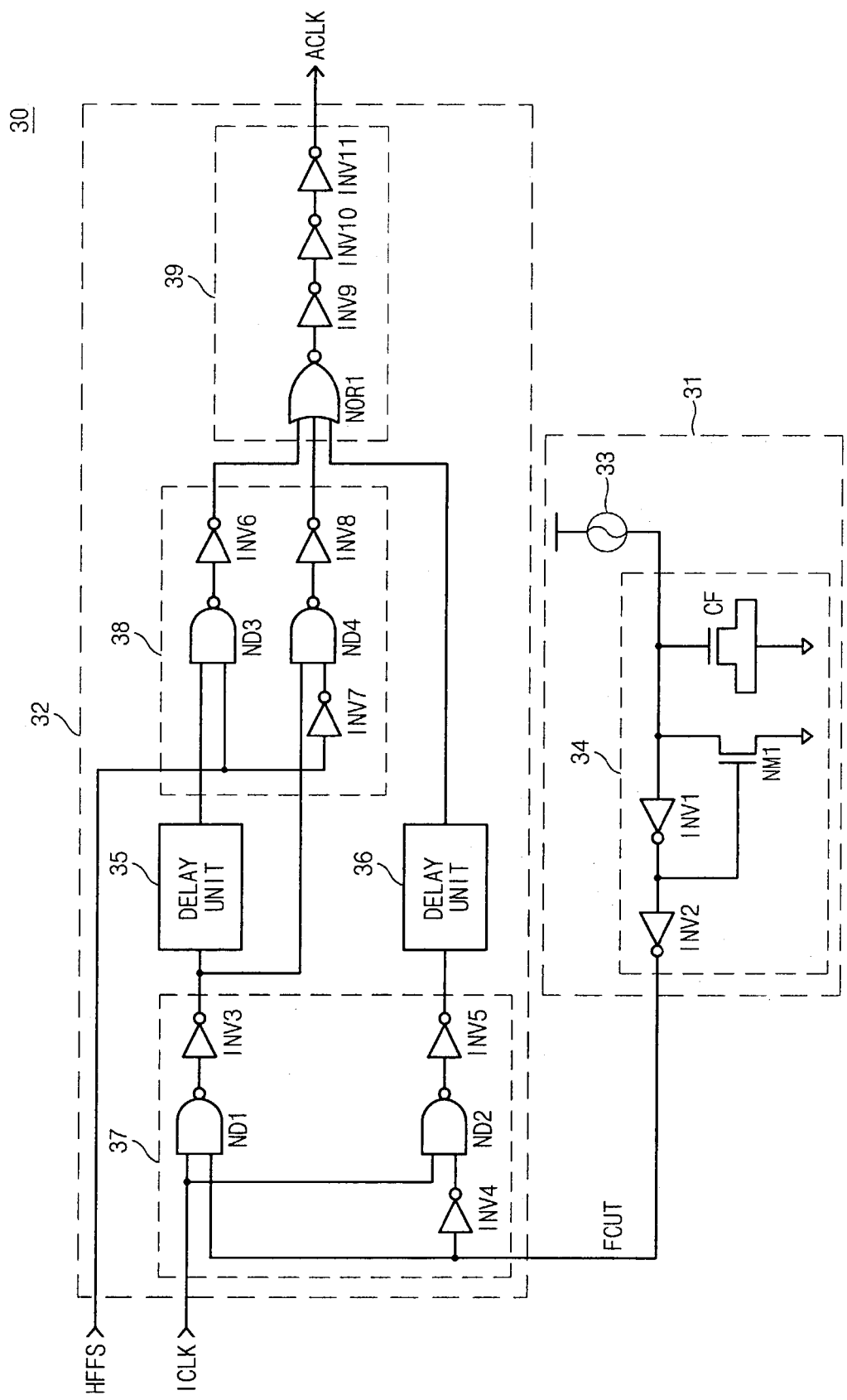
FIG. 3 is a detailed circuit diagram illustrating an auxiliary delay unit in the block diagram of FIG. 2.

FIG. 3 is a detailed circuit diagram illustrating the auxiliary delay line 30 in the block diagram of FIG. 2. The auxiliary delay line 30 includes a fuse unit 31 and a variable delay unit 32.

The fuse unit 31 includes a fuse 33 that is cut when an external clock signal ECLK having an ultra low frequency is inputted, and a hold unit 34 for maintaining the level of the fuse cutting signal FCUT which is determined according to the cutting of the fuse 33. The hold unit 34 includes a capacitor CF, inverters INV1 and INV2, and an NMOS transistor NM1.

The variable delay unit 32 includes delay units 35 and 36, selection units 37 and 38 and an output unit 39. The delay unit 35 additionally delays an internal clock signal ICLK outputted from the variable delay line 20 when the external clock signal ECLK has a low frequency while the other delay unit 36 additionally delays an internal clock signal ICLK outputted from the variable delay line 20 when the external clock signal ECLK has an ultra low frequency. Here, the delay value of the delay unit 36 is determined to be larger than that of the delay unit 35. Non-inversion delayers utilizing a plurality of inverter chains are used in the delay units 35 and 36.

The selection unit 37 includes NAND gates ND1 and ND2 and inverters INV3–INV5. The NAND gate ND1 NANDs an internal clock signal ICLK outputted from the variable delay line 20 with a fuse cutting signal FCUT of the fuse unit 31. The inverter INV3 then inverts an output signal from the NAND gate ND1. The NAND gate ND2 NANDs an internal clock signal ICLK outputted from the variable delay line 20 with an inverted fuse cutting signal /FCUT from the inverter INV4. The inverter INV5 then inverts an output signal of the NAND gate ND2. As a result, the selection unit 37 selectively transmits internal clock signals ICLK into the delay units 35 and 36 according to the fuse cutting signals FCUT.

The selection unit 38 includes NAND gate ND3 and ND4 and inverters INV6–INV8. The NAND gate ND3 NANDs an internal clock signal ICLK transmitted by the selection unit 37 with a flag signal HFFS. The inverter INV6 then inverts an output signal of the NAND gate ND3. The NAND gate ND4 NANDs an internal clock signal ICLK transmitted by the selection unit 37 with an inverted flag signal/HFFS from the inverter INV7. The inverter INV8 then inverts an output signal of the NAND gate ND4. As a result, the selection unit 38 selectively transmits an internal clock-signal ICLK transmitted by the selection unit 37 or a clock signal delayed by the delay unit 35 according to the flag signal HFFS.

The output unit 39 includes an NOR gate NOR1 and inverters INV9–INV11. The NOR gate NOR1 NORs the clock signal selectively transmitted by the selection unit 38 and the clock signal delayed by the delay unit 36. Then, the inverters INV9–INV11 sequentially inverts the output signal of the NOR gate NOR1.

Figure 4:
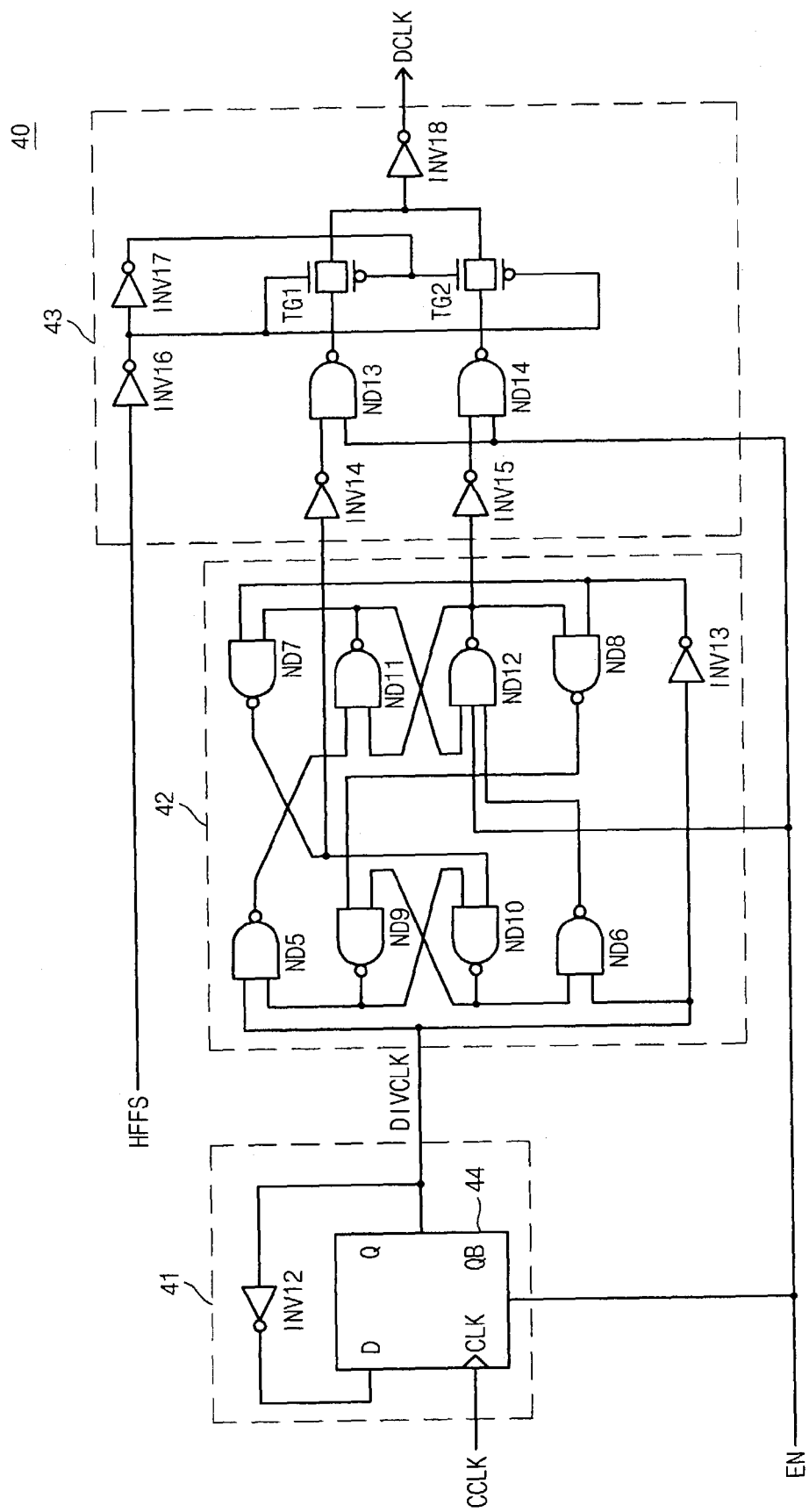
FIG. 4 is a detailed circuit diagram illustrating a programmable divider in the block diagram of FIG. 2.

FIG. 4 is a detailed circuit diagram illustrating the programmable divider 40 from in the block diagram of FIG. 2. The programmable divider 40 includes a ½ divider 41, a selection divider 42 and a selection unit 43.

The ½ divider 41 includes D flip-flop 44 for receiving a compensation clock signal CCLK outputted from the compensation delay unit 90 to a clock input terminal CLK, and an inverter INV12 for inverting an output signal from the D-flip-flop 44 and feeding the signal back to a data input terminal of the D flip-flop 44.

The selection divider 42 includes NAND gates ND5–ND12 and an inverter INV13. An output clock signal of the NAND gate ND7 is divided into ½. An output clock signal of the NAND gate ND12 is outputted without division.

The selection unit 43 includes NAND gates ND13 and ND14, inverters INV14–INV18 and transmission gates TG1 and TG2. The NAND gates ND13 and ND14 NAND each output clock signal inverted by the inverters INV14 and INV15 with an enable signal EN, respectively. The transmission gates TG1 and TG2 selectively transmit output signals of the NAND gates ND13 and ND14 controlled by an inverted flag signal/HFFS by the inverter INV 16 and a flag signal HFFS sequentially inverted by the inverter INV16 and the inverter INV17. The inverter INV18 outputs a divided clock signal DCLK by reverse-driving a clock signal selectively transmitted by the transmission gates TG1 and TG2. As a result, the selection unit 43 selectively transmits output clock signals of the selection divider 42 according to the flag signals HFFS.

The operation of the register controlled delay locked loop circuit is now described. When an external clock signal ECLK of ultra low frequency (e.g. below 66 MHz) is applied to the register controlled delay locked loop circuit, the fuse 33 of the fuse unit 31 is cut. When the fuse 33 is cut, the delay unit 36, having a long delay time, receives an internal clock signal ICLK and outputs an auxiliary clock signal ACLK according to the fuse cutting signal FCUT at a low level. As a result, a large number of unit delay cells used to compare the phases for a period of an external clock signal ECLK of ultra low frequency may be decreased, thereby reducing layout area, consumption power and synchronization time.

On the other hand, when an external clock signal ECLK having a low frequency (e.g. below 100 MHz or below 133

MHz) is applied to the register controlled delay locked loop circuit, the fuse 33 of the fuse unit 31 is connected. As a result, a path is determined by the NAND gate ND1 and the inverter INV3 of the selection unit 37 according to the fuse cutting signal FCUT at a high level. Because the flag signal HFFS is at a low level, an output clock signal of the inverter INV3 is outputted without delay. As a result, the maximum operation frequency when comparing the phases for a period may be improved because the phases of a division clock signal DCLK divided into ¼ by the programmable divider 40 are compared.

In addition, when an external clock signal ECLK having a high frequency (e.g. over 200 MHz) is applied to the register controlled delay locked loop circuit, the fuse 33 of the fuse unit 31 is connected. As a result, a path is determined by the NAND gate ND1 and the inverter INV3 of the selection unit 37 according to the fuse cutting signal FCUT at a high level. Because the flag signal HFFS is at a high level, the programmable divider 40 operates as a ½ divider and compares the phases for two periods to increase the maximum operation frequency.

The synchronization time may be decreased because an output signal from the inverter INV3 in the variable delay unit 31 is outputted into a clock signal delayed by the delay unit 35, and jitter may also be reduced because the number of unit delay cells are decreased.

High-speed DDR SDRAMs have different package types in the same chip according to the field of application because the SDRAMs are used for memory of graphic cards supporting moving pictures as well as the main memory of a PC. As a result, the size of output drivers in an on-chip is differentiated and then load capacitance is also differentiated. Here, it is difficult to form the optimum operation condition due to skewing of the clock signals. Accordingly, the problem due to clock skew may be solved by installing the compensation delay unit 90 in the register controlled delay locked loop circuit of FIG. 2.

Figure 5:
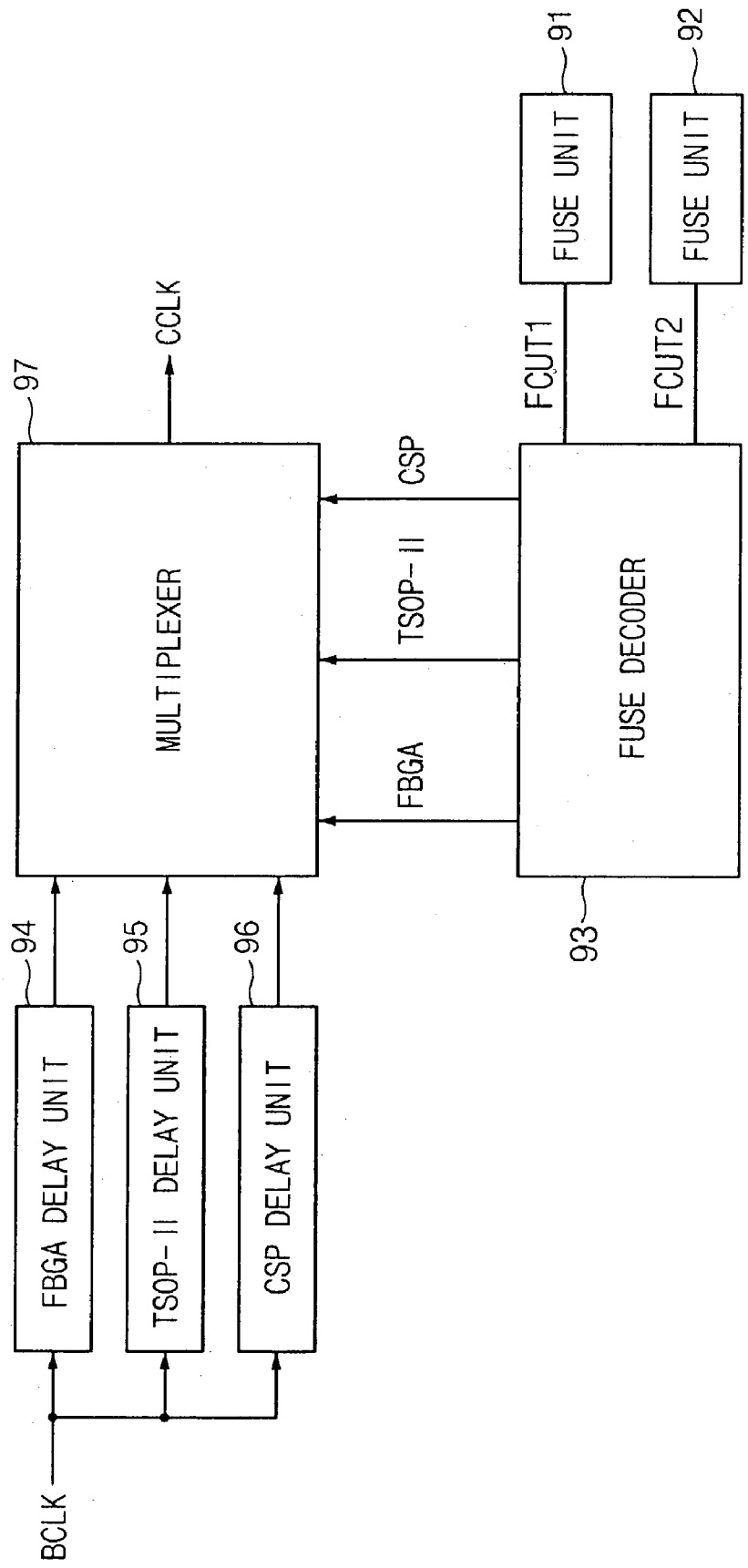
FIG. 5 is a detailed-circuit diagram illustrating a compensation delay unit of the block diagram of FIG. 2.

FIG. 5 is a detailed block diagram illustrating a compensation delay unit 90 of the register controlled delay locked loop circuit. The compensation delay unit 90 includes fuse units 91 and 92, a fuse decoder 93, replica delay units including a FBGA (Fine Pitch Ball Grid Array) delay unit 94, a TSOP (Thin Small Outline Package)-II delay unit 95 and a CSP (Chip Size Package) delay unit 96, and a selection unit such as a multiplexer 97.

The fuse units 91 and 92 have the same structure as the fuse unit 31 of the auxiliary delay unit 30.

The fuse decoder 93 decodes the fuse cutting signals FCUT1 and FCUT2 of the fuse units 91 and 92 and then outputs selection signals FBGA, TSOP and CSP.

The FBGA delay unit 94, the TSOP-II delay unit 95 and the CSP delay unit 96 each delay output clock signals BCLK of the dummy clock buffer 80 for a predetermined delay time.

The multiplexer 97 selects one of the clock signals delayed by the delay units 94, 95 and 96 by using selection signals FBGA, TSOP and CSP of the fuse decoder 93, and then outputs a compensation clock signal CCLK.

As a result, due to the compensation delay unit 90, the optimum replica delay units 94, 95 and 96 corresponding with each package type may be embodied, and the register controlled delay locked loop circuit may also be embodied by selecting a delay unit corresponding with each package type according to the fuse option.

As discussed earlier, the clock synchronization device has the effect of reducing synchronization time by using an auxiliary delay circuit for external clock signals of ultra low frequency, low frequency and high frequency. The optimum clock synchronization device may be embodied in semiconductor memory devices such as high-speed DDR SDRAM by using a programmable divider for external clock signals of low frequency or high frequency to expand the range of the maximum operation frequency. Additionally, although the package is changed according to the semiconductor memory devices being used, the optimum clock synchronization device corresponding with each package type may also be embodied by using the optimum replica delay circuit corresponding to the package type.

Although preferred examples have been disclosed for illustrative purposes, those of ordinary skill in the art will appreciate that the scope of this patent is not limited thereto, On the contrary, this patent covers all devices and methods falling within the scope and spirit of the accompanying claims.

What is claimed is:

1. A clock synchronization device comprising:
    a variable delay line arranged to delay an external clock signal for a predetermined time and output an internal clock signal;
    an auxiliary delay line arranged to delay an internal clock signal from the variable delay line by differentially setting a delay path, from among a plurality of delay paths, according to a frequency of the external clock signal;
    a programmable divider arranged to differentially set a division rate according to the frequency of the external clock signal;
    a phase detection unit arranged to compare a phase of an output clock signal from the programmable divider with a phase of an output clock signal from a dummy circuit, the dummy circuit having the same structure as circuits arranged to output the internal clock signal; and
    a shift register arranged to adjust the delay time of the variable delay line according to output signals from the phase detector.

2. The clock synchronization device according to claim 1, wherein the variable delay line comprises a plurality of unit delay cells connected in series.

3. The clock synchronization device according to claim 1, wherein the auxiliary delay line is further arranged to set a delay path having a long delay time when the external clock signal has a low frequency.

4. The clock synchronization device according to claim 1, wherein each delay path of the auxiliary delay line comprises a different number of inverters.

5. The clock synchronization device according to claim 1, wherein each delay path of the auxiliary delay line is selected by detecting the frequency of the external clock signal and cutting a fuse corresponding to the detection result to generate a signal.

6. The clock synchronization device according to claim 1, wherein each delay path of the auxiliary delay line is selected by detecting the frequency of the external clock signal and using a flag signal corresponding to the detection result.

7. The clock synchronization device according to claim 1, wherein the programmable divider is further arranged to set a division period by detecting the frequency of the external clock signal and using a flag signal corresponding to the detection result.

8. The clock synchronization device according to claim 1, wherein the programmable divider is further arranged to set a low delay rate when the external clock signal has a low frequency.

9. The clock synchronization device according to claim 1, wherein the dummy circuit comprises:
- a dummy variable delay line having the same structure as the variable delay line;
- a dummy auxiliary delay line having the same structure as the auxiliary delay line;
- a dummy input/output data buffer having the same structure as an input/output data buffer;
- a dummy clock buffer having the same structure as the clock buffer; and
- a dummy programmable divider having the same structure as the programmable divider.

10. The clock synchronization device according to claim 1, wherein the dummy circuit comprises a compensation delay unit arranged to compensate the delay time corresponding to a package type.

11. The clock synchronization device according to claim 10, wherein the compensatory delay unit comprises:
- a plurality of replica delay units having a delay time corresponding to the package type;
- a plurality of fuse units corresponding to the package type;
- a fuse decoder arranged to decode cutting signals from the plurality of fuse units; and
- a selection unit arranged to select one of the output signals from the plurality of replica delay units by using output signals from the fuse decoder.

* * * * *